United States Patent
Uchida

(10) Patent No.: US 9,635,291 B2
(45) Date of Patent: Apr. 25, 2017

(54) IMAGE CAPTURING APPARATUS AND MOBILE TELEPHONE

(71) Applicant: CANON KABUSHIKI KAISHA, Tokyo (JP)

(72) Inventor: Mineo Uchida, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 13 days.

(21) Appl. No.: 14/553,366

(22) Filed: Nov. 25, 2014

(65) Prior Publication Data

US 2015/0156428 A1    Jun. 4, 2015

(30) Foreign Application Priority Data

Nov. 29, 2013  (JP) ................................ 2013-248343
Oct. 24, 2014  (JP) ................................ 2014-217662

(51) Int. Cl.
*H04N 5/232*    (2006.01)
*H04N 5/369*    (2011.01)
(Continued)

(52) U.S. Cl.
CPC .......... *H04N 5/3696* (2013.01); *H04N 5/376* (2013.01); *H04N 5/37457* (2013.01);
(Continued)

(58) Field of Classification Search
None
See application file for complete search history.

(56) References Cited

U.S. PATENT DOCUMENTS 8,228,425 B2* 7/2012 Cieslinski ............. H04N 5/335
                                              257/459
9,184,198 B1* 11/2015 Miao ................. H01L 27/14625
(Continued)

FOREIGN PATENT DOCUMENTS

JP    2000-156823 A    6/2000
JP    2001-124984 A    5/2001
(Continued)

OTHER PUBLICATIONS

The above foreign patent documents were cited in the Aug. 26, 2016 Korean Office Action, which is enclosed without an English Translation, that issued in Korean Patent Application No. 10-2014-0162263.
(Continued)

*Primary Examiner* — Roberto Velez
*Assistant Examiner* — Quan Pham
(74) *Attorney, Agent, or Firm* — Cowan, Liebowitz & Latman, P.C.

(57) ABSTRACT

There is provided an image capturing apparatus capable of controlling focus detecting pixels independently of the remaining image capturing pixels while maintaining the sensitivity of an image sensor and obtaining high image quality. The image capturing apparatus includes a first semiconductor chip, and a second semiconductor chip stacked on the first semiconductor chip. On the first semiconductor chip, the light receiving sections of a first pixel group and second pixel group, and a first pixel driving circuit configured to drive the pixels of the first pixel group are arranged. On the second semiconductor chip, a second pixel driving circuit configured to drive the pixels of the second pixel group is arranged.

22 Claims, 12 Drawing Sheets

(51) Int. Cl.
*H04N 5/376* (2011.01)
*H04N 5/374* (2011.01)
*H04N 5/335* (2011.01)
*H04N 5/3745* (2011.01)
*H01L 27/146* (2006.01)

(52) U.S. Cl.
CPC .. *H01L 27/146* (2013.01); *H01L 2225/06503* (2013.01); *H04N 5/23212* (2013.01); *H04N 5/335* (2013.01)

(56) References Cited

U.S. PATENT DOCUMENTS

| | | | | |
|---|---|---|---|---|
| 2008/0001067 | A1* | 1/2008 | Asaba | H04N 5/343 250/208.1 |
| 2012/0293698 | A1* | 11/2012 | Sukegawa | H01L 25/167 348/294 |
| 2013/0293736 | A1* | 11/2013 | Kuwazoe | H04N 5/3696 348/222.1 |
| 2013/0314573 | A1* | 11/2013 | Tsukimura | H04N 5/335 348/302 |
| 2014/0049668 | A1* | 2/2014 | Endo | H04N 5/3456 348/272 |
| 2014/0139715 | A1* | 5/2014 | Fukuoka | H04N 5/3535 348/308 |

FOREIGN PATENT DOCUMENTS

| | | |
|---|---|---|
| JP | 2008067241 A * | 3/2008 |
| JP | 2009-089143 A | 4/2009 |
| JP | 2010-192604 A | 9/2010 |
| JP | 2010-225927 A | 10/2010 |
| JP | 2013-223054 A | 10/2013 |

OTHER PUBLICATIONS

The above foreign patent documents were cited in the Jan. 27, 2017 Japanese Office Action, which is enclosed with an English Translation, that issued in Japanese Patent Application No. 2014217662.

* cited by examiner

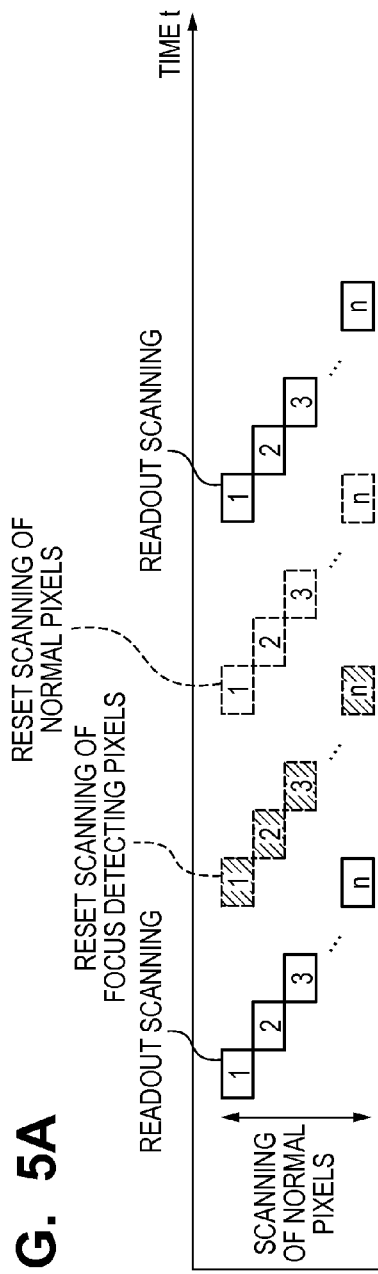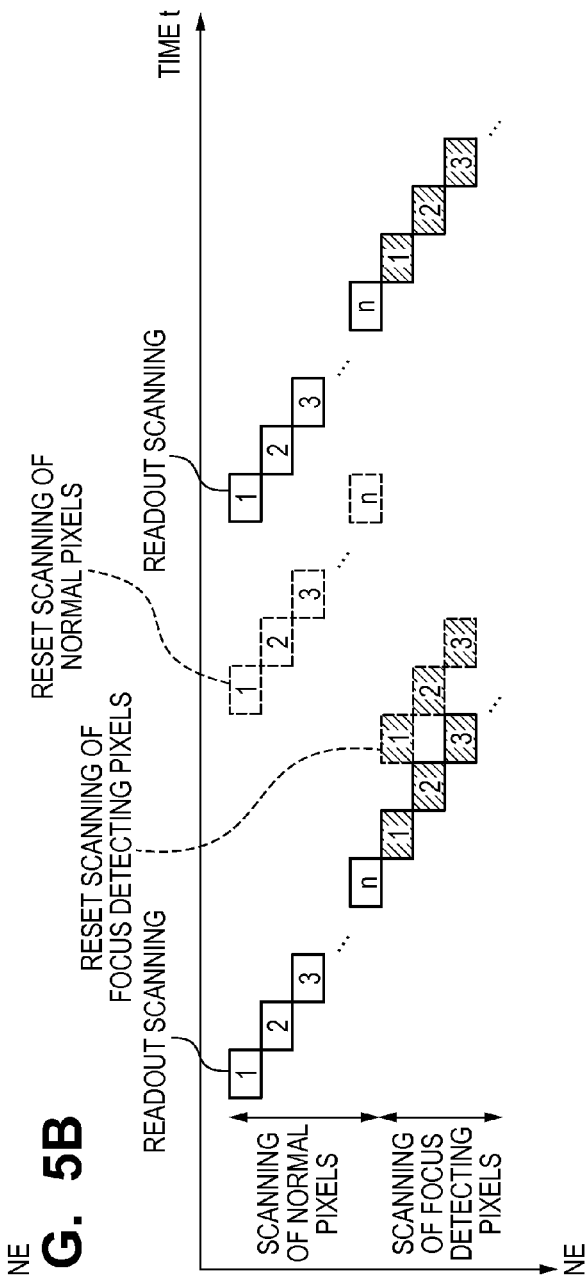
FIG. 5A
FIG. 5B

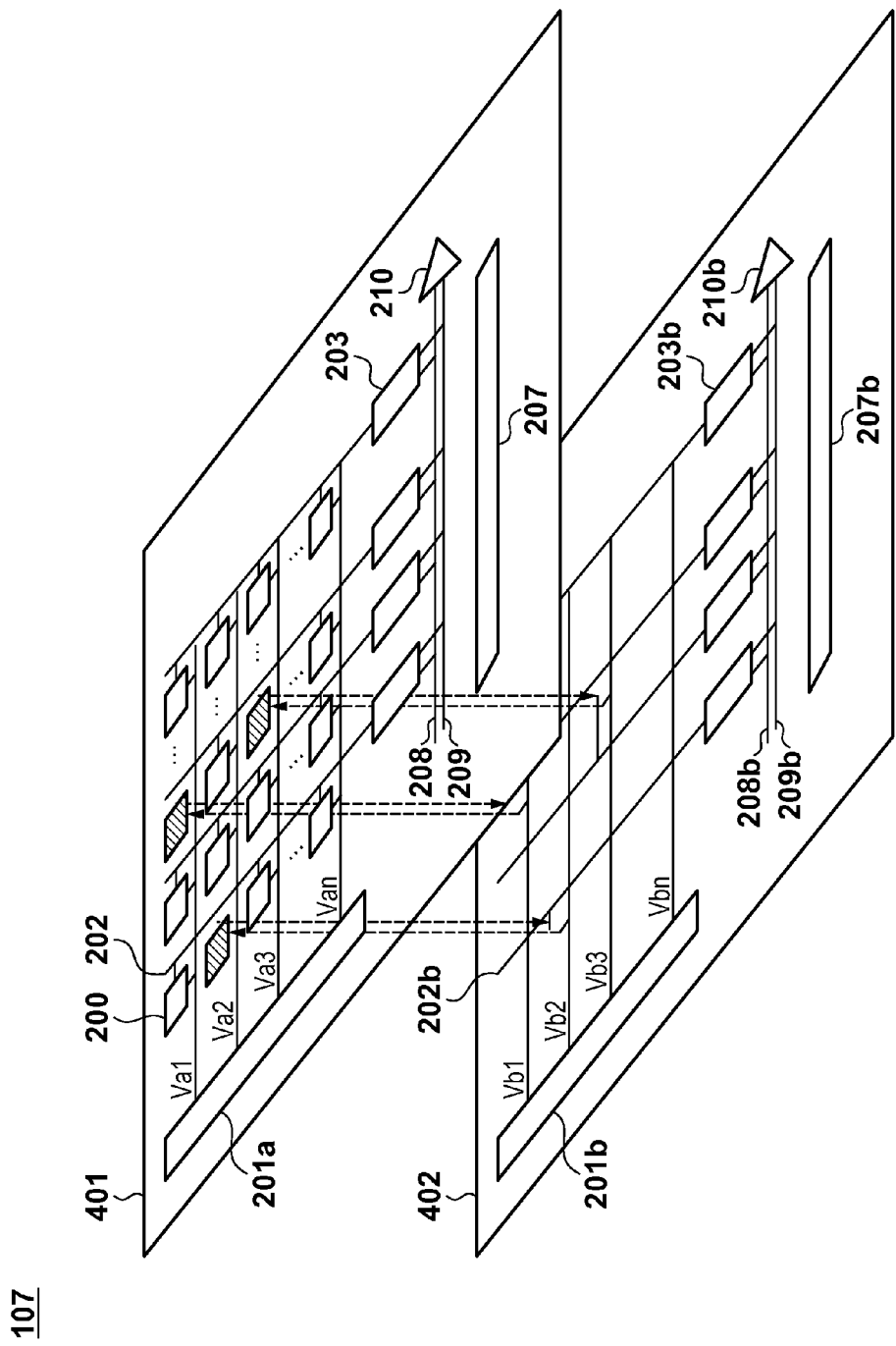

IMAGE CAPTURING APPARATUS AND MOBILE TELEPHONE

BACKGROUND OF THE INVENTION

Field of the Invention

The present invention relates to an image capturing apparatus using an image sensor, and a mobile telephone.

Description of the Related Art

Recently, image capturing apparatuses using image sensors such as a CMOS sensor are becoming multifunctional. Not only generation of a captured image such as a still image/moving image, but also control of the image capturing apparatus such as focus adjustment is performed based on object information obtained by the image sensor.

For example, Japanese Patent Laid-Open No. 2000-156823 has proposed a technique of decentering the sensitive region of a light receiving section from the optical axis of an on-chip microlens in some light receiving elements (pixels) of an image sensor to give a pupil division function, and setting these pixels as focus detecting pixels. Japanese Patent Laid-Open No. 2001-124984 has proposed a technique in which one microlens and two photodiodes are arranged in each pixel of an image sensor, and the respective photodiodes receive beams having passed through different pupils of a photographing lens. By comparing output signals from the two photodiodes, the focus can be detected.

However, in the above-mentioned conventional techniques, it is difficult to control the accumulation time and accumulation timing of the focus detecting pixels independently of those of the remaining normal image capturing pixels. If the driving signals of the image capturing pixels and focus detecting pixels are merely supplied to independently control the accumulation time and accumulation timing, wiring for these signals occupies the light receiving area of each pixel, decreasing the sensitivity.

SUMMARY OF THE INVENTION

The present invention implements an arrangement capable of controlling focus detecting pixels independently of the remaining image capturing pixels while maintaining the sensitivity of an image sensor and obtaining high image quality.

According to one aspect of the present invention, an image capturing apparatus in which a first semiconductor chip and a second semiconductor chip are stacked on each other, the first semiconductor chip includes a pixel portion including a first pixel group and a second pixel group, and a first driving circuit configured to drive pixels of the first pixel group, and the second semiconductor chip includes a second driving circuit configured to drive pixels of the second pixel group.

Further features of the present invention will become apparent from the following description of exemplary embodiments (with reference to the attached drawings).

BRIEF DESCRIPTION OF THE DRAWINGS

FIGS. 5A and 5B are timing charts showing the reset and readout operations of the image sensor according to the first embodiment;

FIG. 10 is a view showing the layout of two chips constituting the image sensor according to the third embodiment;

DESCRIPTION OF THE EMBODIMENTS

Various exemplary embodiments, features, and aspects of the invention will be described in detail below with reference to the drawings.

Note that the present invention is not limited to the following embodiments, and these embodiments are merely examples advantageous for the implementation of the invention. Also, not all combinations of features described in the following embodiments are indispensable for solving problems by the invention.

First Embodiment

Figure 1:
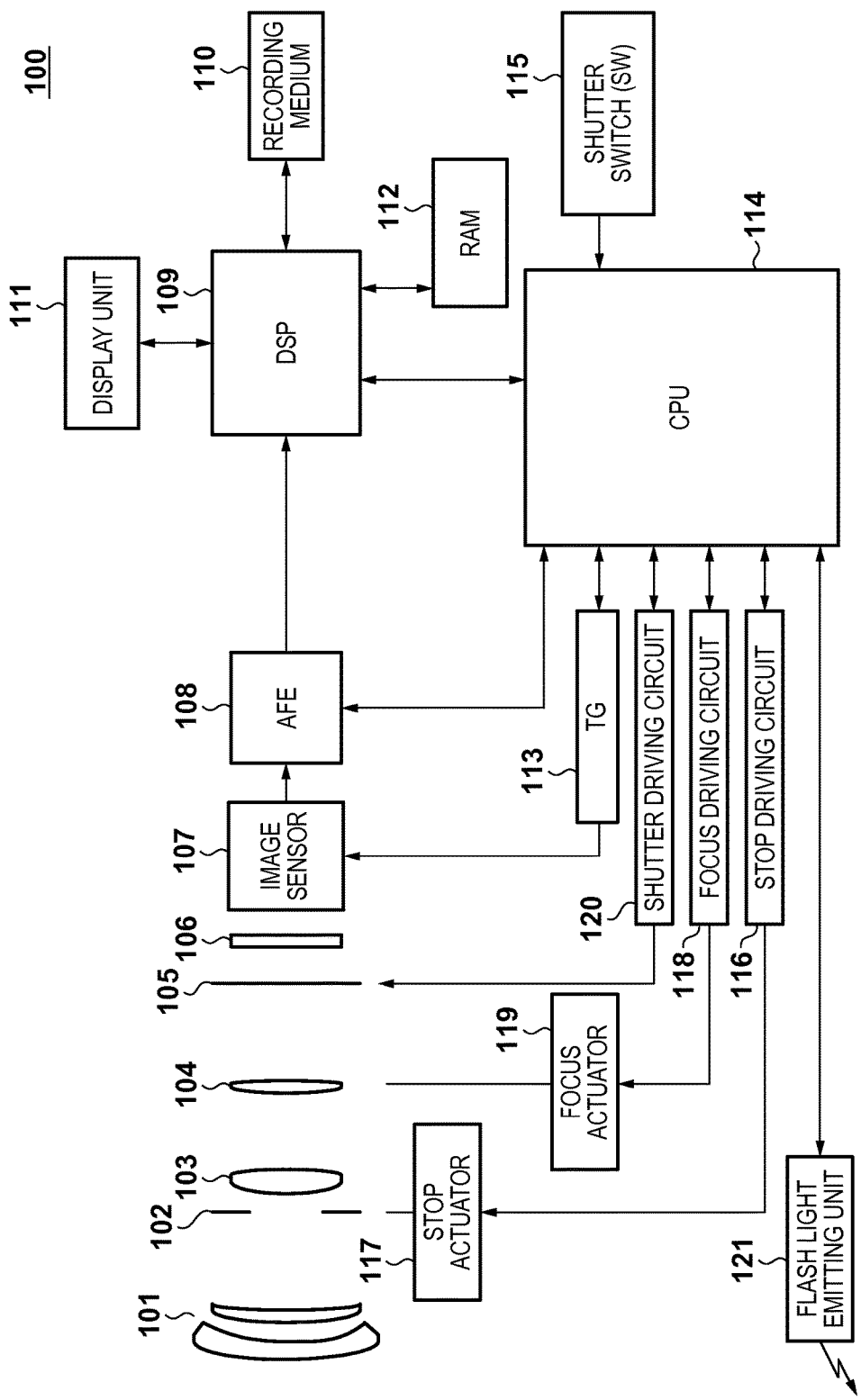
FIG. 1 is a view showing the arrangement of an image capturing apparatus according to the first embodiment.

FIG. 1 is a view showing the arrangement of an image capturing apparatus 100 according to the first embodiment. A first lens group 101 is arranged at the front end of an imaging optical system, and is held to move back and fourth in the optical axis direction. A stop 102 adjusts the light amount at the time of image capturing by adjusting the aperture diameter of the stop 102. A second lens group 103 implements a scaling operation (zoom function) in cooperation with the back-and-forth movement of the first lens group 101. A third lens group 104 adjusts the focus by back-and-forth movement in the optical axis direction.

A mechanical shutter 105 adjusts the amount of light guided to the image sensor 107 in cooperation with reset scanning of an image sensor 107 (to be described later). An optical low-pass filter 106 is an optical element for reducing the false color or moiré of a captured image. The image sensor 107 photoelectrically converts an object image formed by the above-mentioned lens groups. For example, assume that a CMOS image sensor having a Bayer pattern is used for the image sensor 107.

An AFE 108 converts an analog image signal output from the image sensor 107 into a digital signal. A DSP (Digital Signal Processor) 109 performs various image processes including image correction on the digital image signal output from the AFE 108.

A recording medium 110 records image data. A display unit 111 displays a captured image, various menu screens, and the like. For example, a liquid crystal display (LCD) is used for the display unit 111. In a live view operation (to be described later), continuously captured images are sequentially displayed on the display unit 111. A RAM 112 is connected to the DSP 109, and temporarily stores image data and the like. A timing generator (TG) 113 supplies a driving signal to the image sensor 107. A CPU 114 serving as a controller controls the AFE 108, the DSP 109, the TG 113, a stop driving circuit 116, and a focus driving circuit 118.

A shutter switch (SW) 115 transfers, to the CPU 114, an image capturing instruction by the operation of a user. The stop driving circuit 116 controls driving of a stop actuator 117 to drive the stop 102. The focus driving circuit 118 controls driving of a focus actuator 119 to move back and forth the third lens group 104 in the optical axis direction, thereby adjusting the focus. A shutter driving circuit 120 drives the mechanical shutter 105 under the control of the CPU 114.

Figure 2:
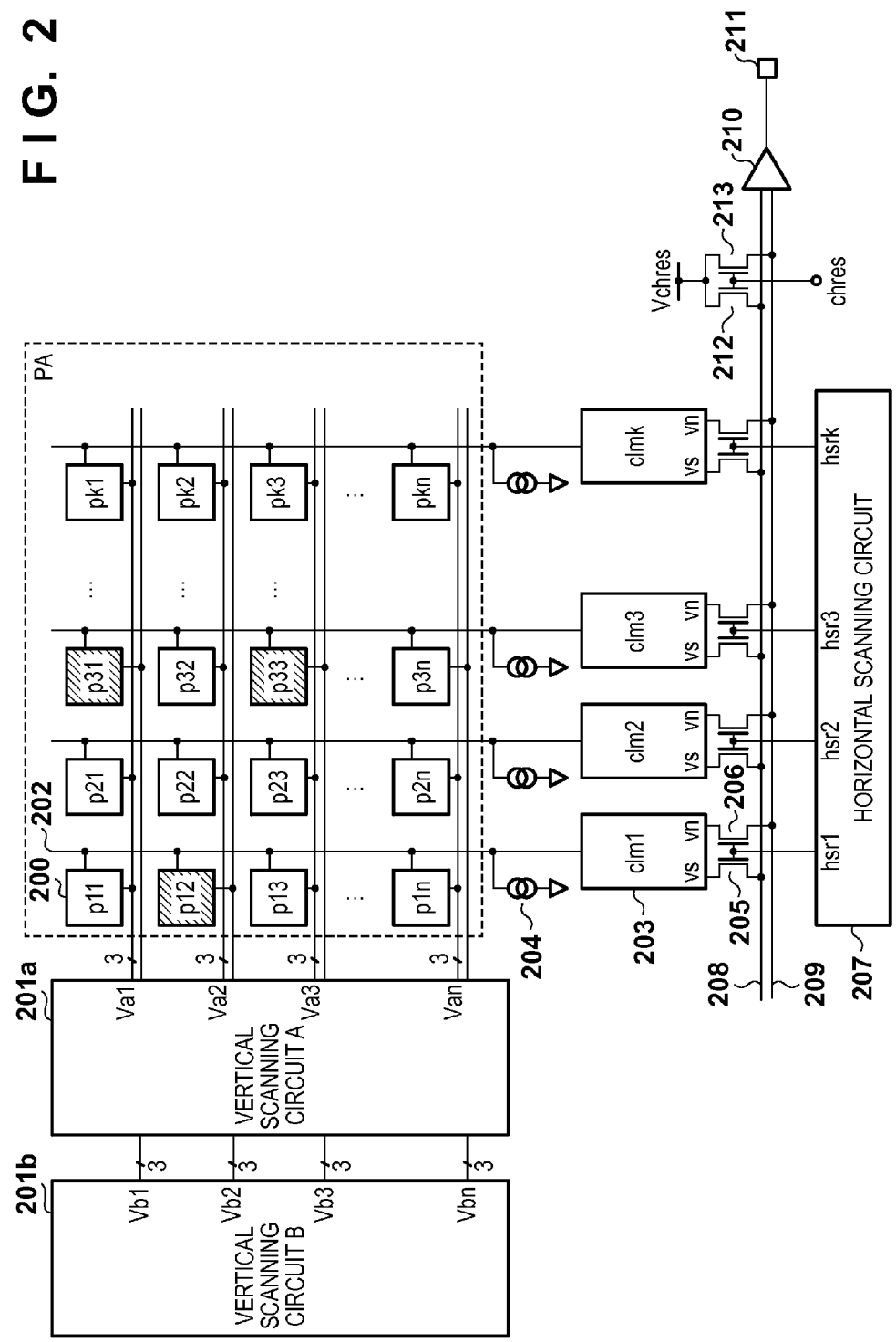
FIG. 2 is a diagram showing the arrangement of an image sensor according to the first embodiment.

FIG. 2 is a diagram showing the arrangement of the image sensor 107. In a pixel region PA, p11 to pkn of a pixel array 200 are laid out in a matrix. Hatched pixels p12, p31, and p33 are non-image capturing pixels used not to generate an image to be recorded or displayed, but for a specific purpose (for focus detection here).

Figure 3A:
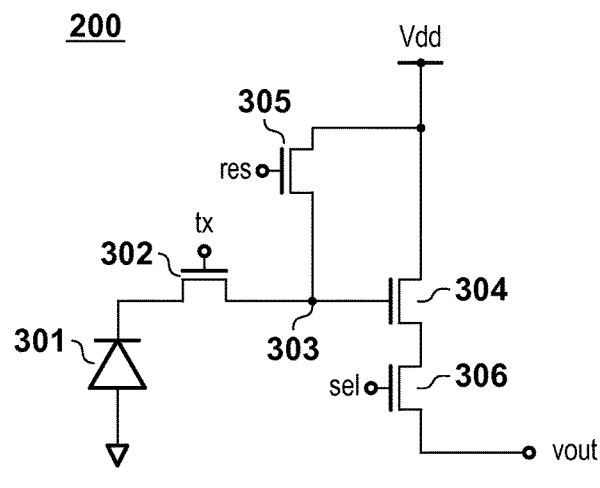
FIGS. 3A to 3D are views each showing the arrangement of each pixel according to the embodiment.

The arrangement of each pixel of the pixel array 200 will be explained with reference to FIG. 3A. A photodiode (PD) 301 serving as a light receiving section photoelectrically converts an incident optical signal, and accumulates charges corresponding to the exposure amount. By changing a signal tx to High level, a transfer gate 302 transfers charges accumulated in the PD 301 to a floating diffusion (FD) 303. The FD 303 is connected to the gate of an amplifier 304, and the amplifier 304 converts, into a voltage value, the amount of charges transferred from the PD 301.

By changing a signal res to High level, a reset switch 305 resets the FD 303. By simultaneously changing the signal tx and signal res to High level, both the transfer gate 302 and reset switch 305 are turned on to reset the charges of the PD 301 via the FD 303.

By changing a signal sel to High level, a pixel selection switch 306 outputs, to an output vout of the pixel array 200, a pixel signal converted into a voltage by the amplifier 304.

Figure 3B:
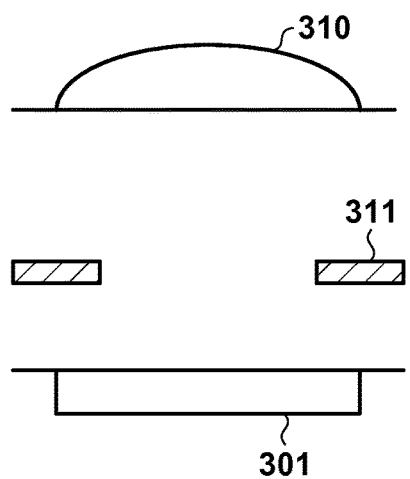
Figure 3C:
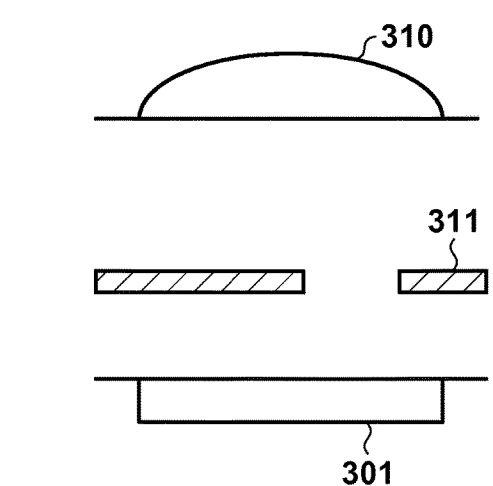
Figure 3D:
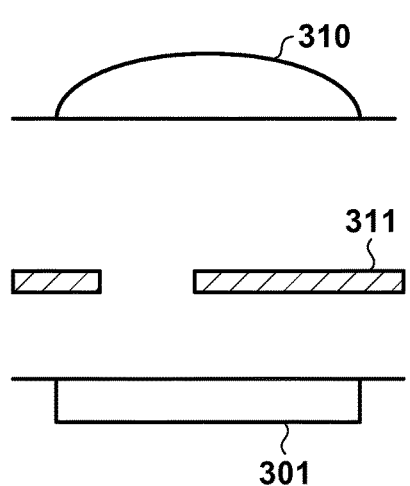

FIGS. 3B to 3D are views each showing the sectional structure of each pixel of the pixel array 200. As shown in FIGS. 3B to 3D, a light-shielding layer 311 intervenes between the PD 301 and a microlens 310. Of these drawings, FIGS. 3C and 3D show the sectional structures of focus detecting pixels. For example, assume that the pixels p12 and p31 have a structure in FIG. 3C, and the pixel p33 has a structure in FIG. 3D. As shown in FIGS. 3C and 3D, the opening of the light-shielding layer 311 is decentered with respect to the microlens 310 and PD 301 to restrict a beam entering the PD 301 from the microlens 310 to a specific direction. FIG. 3B shows the structure of the remaining normal image capturing pixels used to generate a captured image. A plurality of focus detecting pixels as shown in FIGS. 3C and 3D are arrayed, for example, discretely. The focus can be detected by comparing signals acquired from pixels having the structure shown in FIG. 3C, and signals acquired from pixels having the structure shown in FIG. 3D.

Referring back to FIG. 2, a vertical scanning circuit 201a is a first pixel driving circuit which drives pixels of the first pixel group constituted by normal pixels serving as image capturing pixels. A vertical scanning circuit 201b is a second pixel driving circuit which drives pixels of the second pixel group constituted by focus detecting pixels serving as non-image capturing pixels. The vertical scanning circuits 201a and 201b supply driving signal groups Va and Vb to the respective pixels, respectively. The vertical scanning circuit 201a supplies the driving signal group Va to the normal pixels, and the vertical scanning circuit 201b supplies the driving signal group Vb to the focus detecting pixels. The driving signal group Va1 is constituted by driving signals resa_1, txa_1, and sela_1, and the driving signal group Vb1 is constituted by driving signals resb_1, txb_1, and selb_1. This also applies to the driving signal groups Va2, Vb2, Va3, and Vb3 for the second and subsequent rows.

The output Vout of each pixel is connected to a corresponding column common readout circuit 203 via a corresponding vertical output line 202 for each column. Each column common readout circuit 203 performs a CDS operation, amplification of a signal by an amplifier, a sample-and-hold operation, and the like.

The column common readout circuit 203 outputs an N signal vn serving as an output immediately after reset cancellation of the FD 303, and an S signal vs serving as an output after signal transfer of the PD 301. Horizontal transfer switches 205 and 206 are connected to the column common readout circuit 203.

The horizontal transfer switches 205 and 206 are controlled by an output signal hsr* (* is a column number) from a horizontal scanning circuit 207. When the signal hsr* changes to High level, the S signal and N signal are transferred to horizontal output lines 208 and 209, respectively.

The horizontal output lines 208 and 209 are connected to the input of a differential amplifier 210. The differential amplifier 210 calculates the difference between the S signal and the N signal. At the same time, the differential amplifier 210 applies a predetermined gain, and outputs a final image signal to an output terminal 211.

When a signal chres changes to High, horizontal output line reset switches 212 and 213 are turned on to reset the horizontal output lines 208 and 209 to a reset voltage Vchres.

Figure 4:
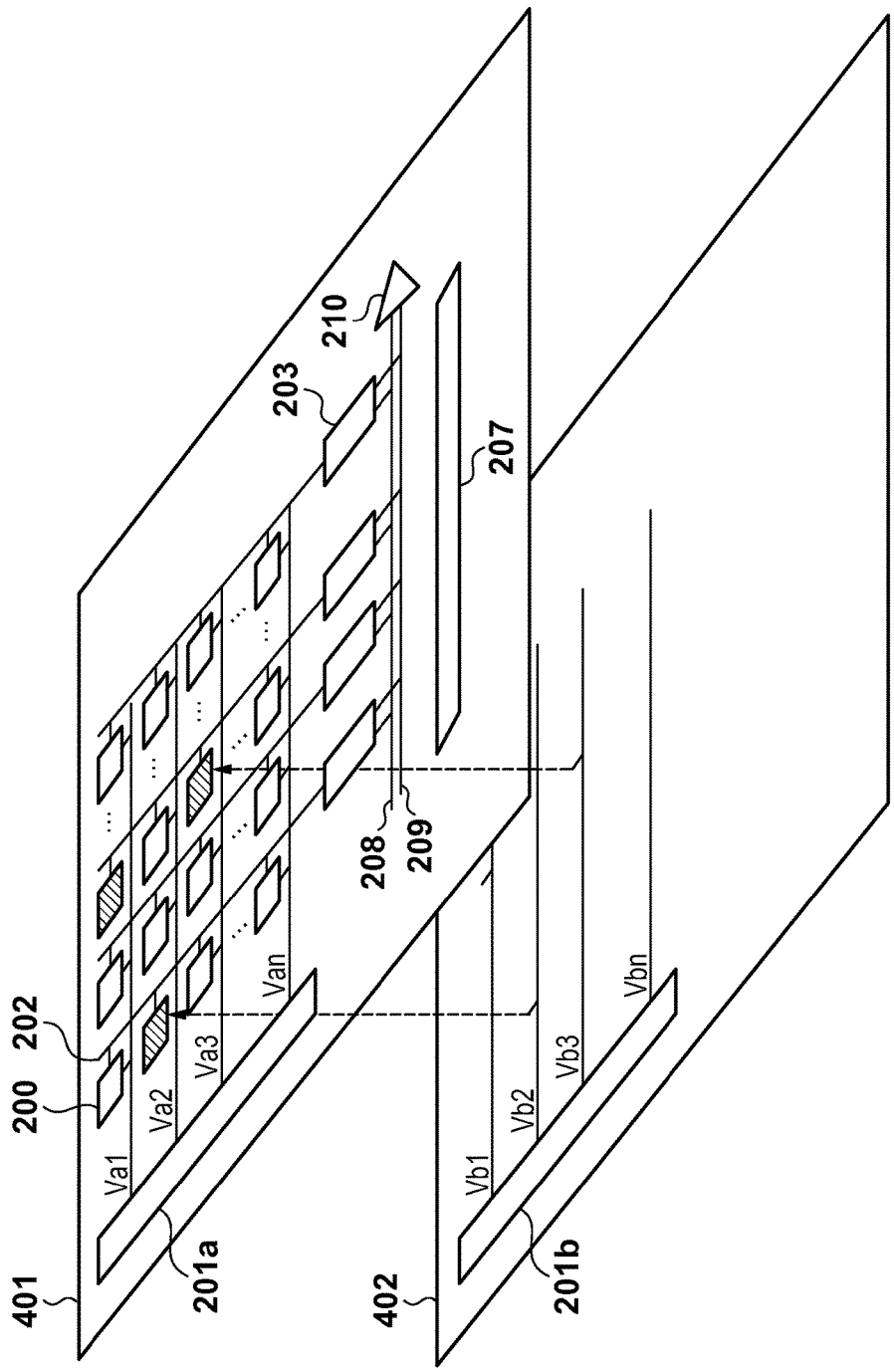
FIG. 4 is a view showing the layout of two chips constituting the image sensor according to the first embodiment.

FIG. 4 shows the arrangement of the semiconductor chip of the image sensor 107 and the layout of respective blocks. The image sensor 107 is formed by stacking, on each other, a first semiconductor chip 401 serving as a first integrated circuit, and a second semiconductor chip 402 serving as a second integrated circuit. On the first semiconductor chip 401, the pixel array 200, vertical scanning circuit 201a, column common readout circuits 203, horizontal scanning circuit 207, and the like are laid out. Signal lines for supplying the driving signal group Va are also laid out on the first semiconductor chip 401.

On the second semiconductor chip 402, the vertical scanning circuit 201b, and signal lines for supplying the driving signal group Vb are laid out. The signal lines for supplying the driving signal group Vb are electrically connected to MOS transistors in the pixel array 200 of the first semiconductor chip 401 via connection points (dotted lines) formed from micro-bumps or the like.

In the embodiment, the signal lines for supplying the driving signal group Vb are wired on the second semiconductor chip 402. Since the opening area of the pixel array 200 formed on the first semiconductor chip 401 is not occupied, the light collection efficiency to the PD can be increased to obtain an image quality at a high S/N ratio.

FIG. 5A is a timing chart showing the reset operation and readout operation of the image sensor 107. A solid line frame represents the readout operation of the image sensor 107, and a dotted line frame represents the reset operation. A hatched dotted line frame represents the reset operation of the focus detecting pixel. Note that a numeral in each frame is a line number.

In readout scanning, the signals of the normal pixels and focus detecting pixels are sequentially read out from the first row by the operations of the vertical scanning circuits 201a and 201b. Subsequently, reset scanning starts at a predetermined timing in order to start accumulation for the next frame. First, the vertical scanning circuit 201b performs reset scanning of the focus detecting pixels. Then, the vertical scanning circuit 201a performs reset scanning of the normal pixels. Needless to say, the order of reset scanning for focus detection and reset scanning of the normal pixels may be reversed depending on the situation. Since the signal lines for supplying the driving signal group Va of the normal pixels, and the signal lines for supplying the driving signal group Vb of the focus detecting pixels are arranged separately, the respective reset scanning operations can be performed at optimum timings. The next readout scanning starts at a timing corresponding to the frame rate.

With the above-described arrangement, while obtaining an image at a high S/N ratio, the accumulation time of the focus detecting pixels can be controlled independently of that of the remaining normal pixels, and a high-accuracy focus-detecting operation can be performed.

Note that it is also possible to adopt an arrangement in which readout scanning of the focus detecting pixels is performed after readout scanning of the normal pixels. FIG. 5B is a timing chart in this case. Hatched frames represent the reset operation and readout operation of the focus detecting pixels. Readout scanning of the focus detecting pixels starts subsequently to readout scanning of the normal pixels. Then, reset scanning of the focus detecting pixels starts at a timing suitable as the accumulation time for focus detection. Also, reset scanning of the normal pixels is performed at a timing suited for image generation. After that, readout scanning of the next frame is performed in the order of the normal pixels and focus detecting pixels.

The arrangement in which the vertical scanning circuit 201a for outputting the driving signal group Va, and the vertical scanning circuit 201b for outputting the driving signal group Vb are arranged independently has been explained. However, one vertical scanning circuit may output the driving signal groups Va and Vb.

Second Embodiment

In FIG. 5B described above, in readout scanning of the focus detecting pixels, the readout operation needs to be repeated by the number of lines on which the focus detecting pixels are laid out, and the readout operation takes time. The second embodiment will describe an arrangement in which the readout time is shortened by simultaneously reading out the signals of focus detecting pixels on a plurality of lines.

Figure 6:
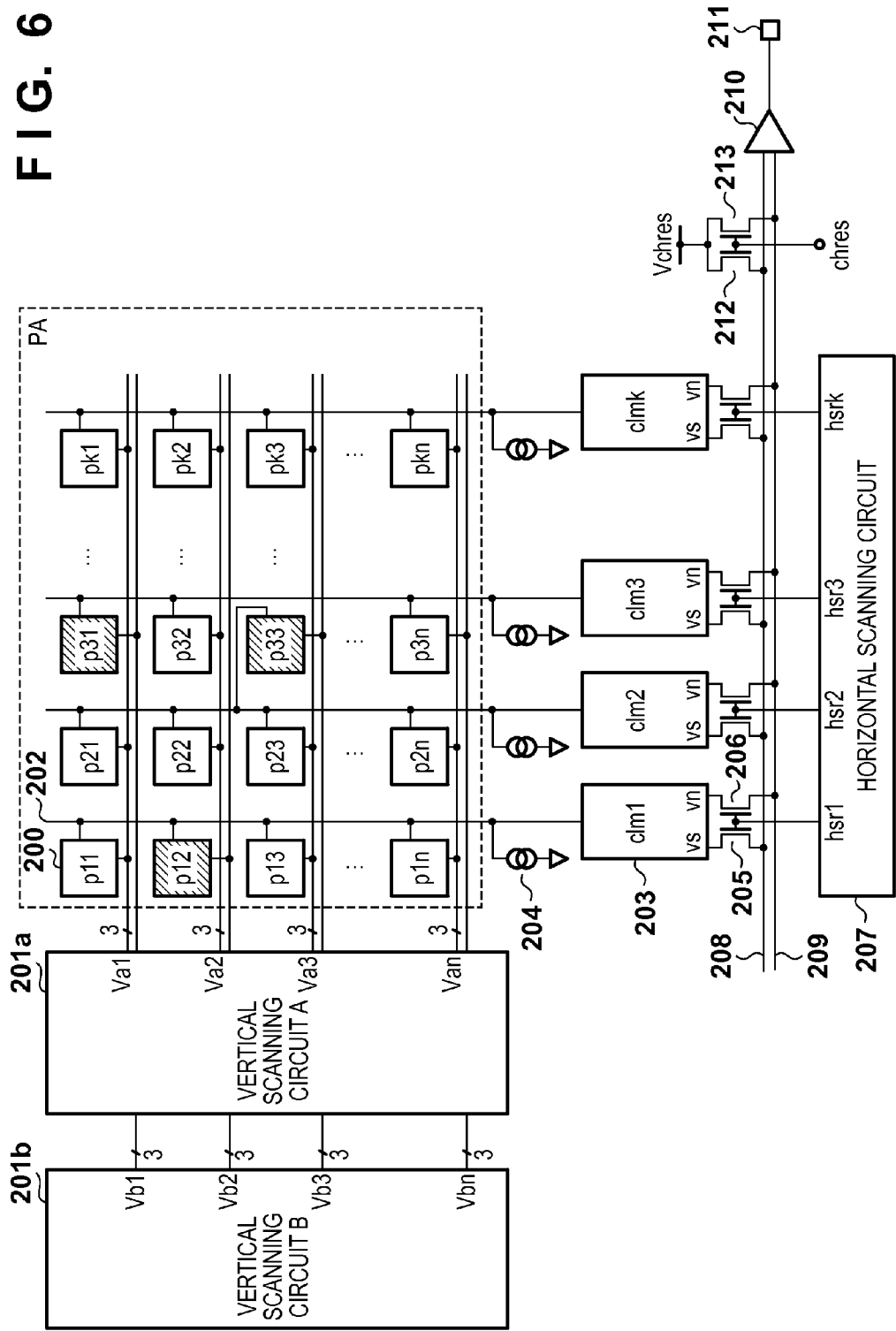
FIG. 6 is a diagram showing the arrangement of an image sensor according to the second embodiment.

FIG. 6 is a diagram showing the arrangement of an image sensor 107 according to the second embodiment. The arrangement in FIG. 6 is different from the arrangement in FIG. 2 in that a focus detecting pixel p33 is connected to a vertical output line connected to clm2. Hence, focus detecting pixels p12, p31, and p33 are connected to different vertical output lines 202. With this arrangement, focus detecting signals can be simultaneously read out from the focus detecting pixels respectively laid out on the first, second, and third rows.

Figure 7:
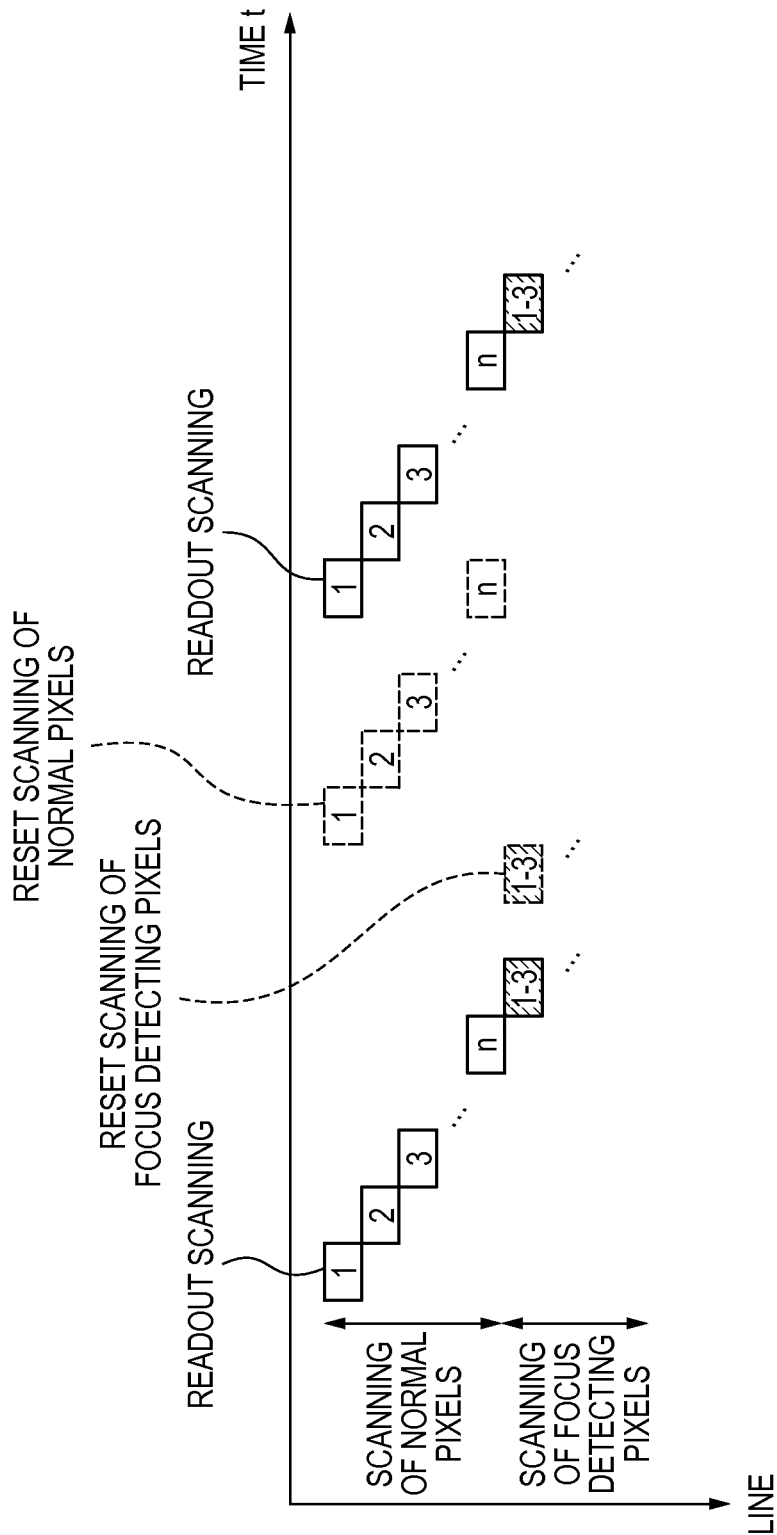
FIG. 7 is a timing chart showing the operation of the image sensor according to the second embodiment.

FIG. 7 is a timing chart. After readout scanning of the normal pixels, the signals of the focus detecting pixels on the first to third rows are read out. As for the fourth and subsequent rows, signals can be simultaneously read out from every three rows as long as focus detecting pixels are laid out in the same pattern as that of the focus detecting pixels p12, p31, and p33. As a result, the total readout time is shortened. Since readout scanning is performed simultaneously for every three rows, reset scanning is also simultaneously performed for every three rows.

Third Embodiment

In the above-described second embodiment, the normal pixels and focus detecting pixels share the same vertical output line 202, so signal readout of the normal pixels and signal readout of the focus detecting pixels need to be temporally exclusive. In pixels, such as the pixel p33, which are different from the remaining normal pixels and focus detecting pixels in the positional relationship with the connected vertical output line, the optical conditions and the analog characteristic of the pixel circuit may differ from those of the remaining pixels. The third embodiment will describe an arrangement which solves these problems by arranging, on a second semiconductor chip 402, vertical output lines for reading out the signals of focus detecting pixels, column common readout circuits, and the like.

Figure 8:
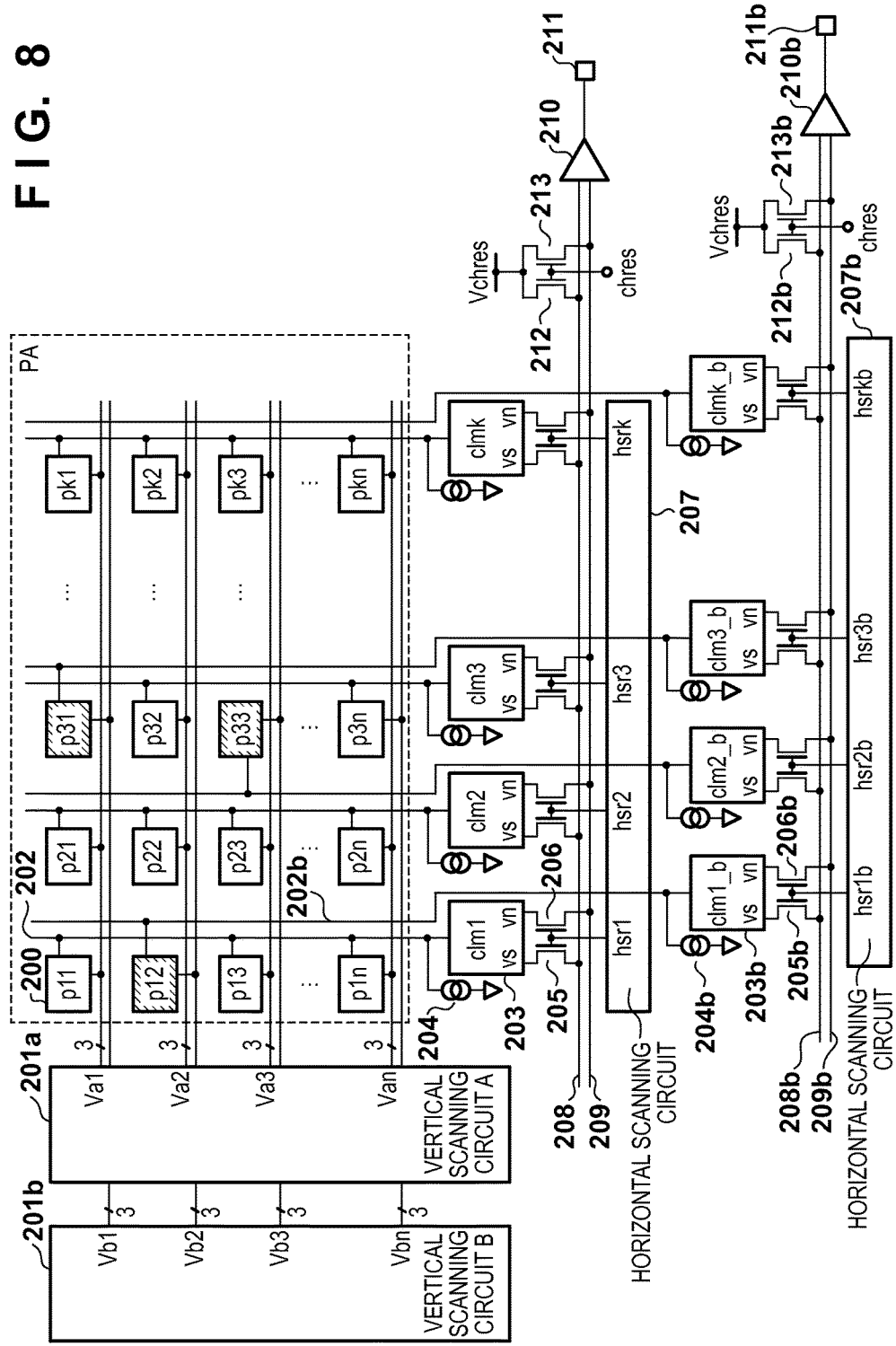
FIG. 8 is a diagram showing the arrangement of an image sensor according to the third embodiment.

FIG. 8 is a diagram showing the arrangement of an image sensor 107 according to the third embodiment. An output Vout of each focus detecting pixel is connected to a corresponding column common readout circuit 203b via a corresponding vertical output line 202b dedicated to the focus detecting pixels. A current source 204b is connected to each vertical output line 202b. Focus detecting signals having undergone the CDS operation, and amplification of a signal by an amplifier in the column common readout circuit 203b for the focus detecting pixels are transferred to horizontal output lines 208b and 209b by a horizontal scanning circuit 207b, and read out from an image sensor 107.

Figure 9:
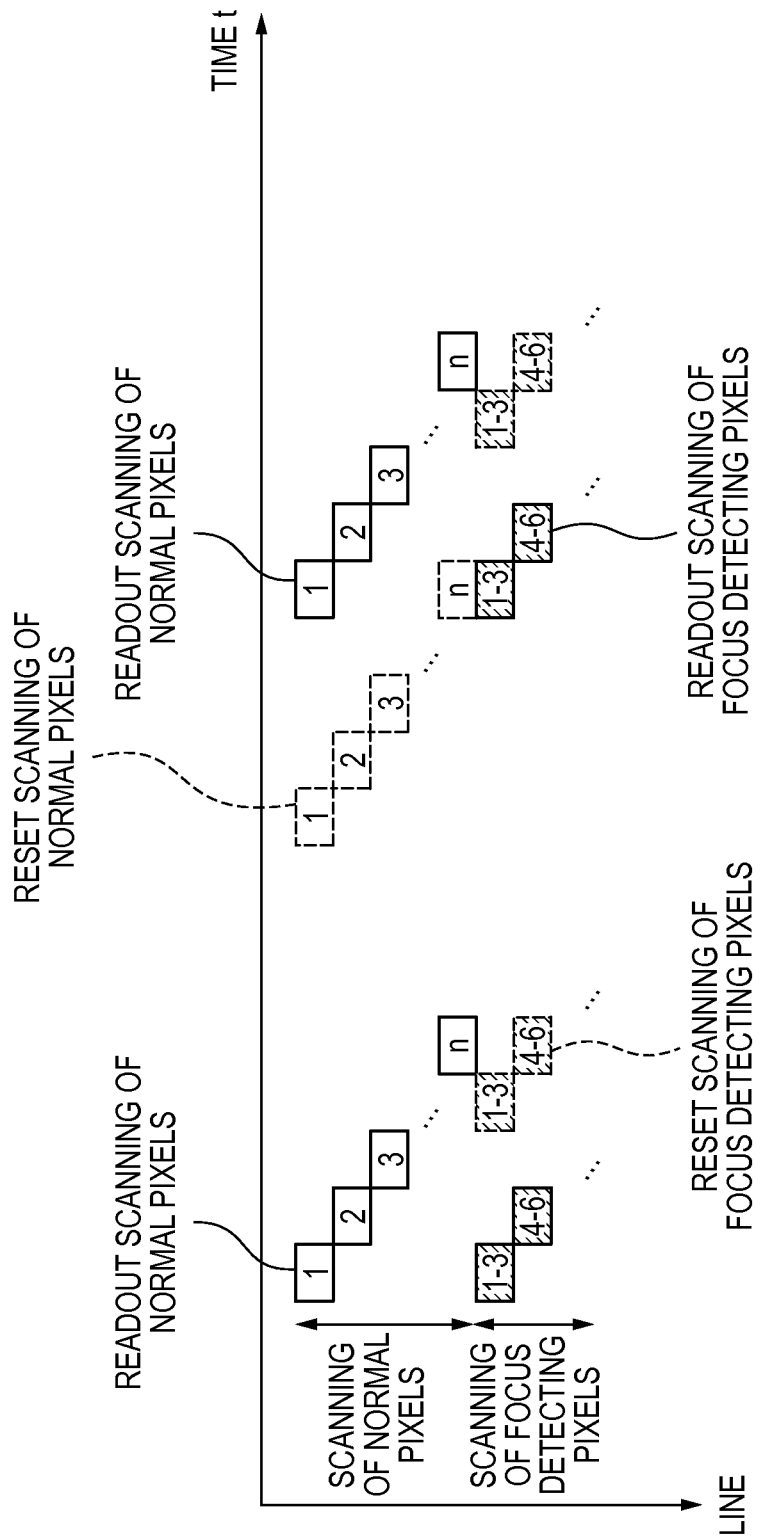
FIG. 9 is a timing chart showing the operation of the image sensor according to the third embodiment.

FIG. 9 is a timing chart showing the reset and readout operations of the image sensor 107 according to the third embodiment. The vertical output line 202b for reading out the signal of the focus detecting pixel is arranged independently of a vertical output line 202 for reading out the signal of the normal pixel. Thus, the signal of the focus detecting pixel can be read out temporally parallel to signal readout of the normal pixel. The signal can be read out at a timing optimum for the focus-detecting operation. In FIG. 9, the signal readout cycle (frame rate) of the focus detecting pixel is equal to that of the normal pixel. However, if necessary, a signal can also be read out in a cycle different from that of the normal pixel.

FIG. 10 shows the arrangement of the semiconductor chip of the image sensor 107 and the layout of respective blocks according to the third embodiment. The vertical output lines 202b, the column common readout circuits 203b, the horizontal scanning circuit 207b, the horizontal output lines 208b and 209b, a differential amplifier 210b, and the like, which are used for signal readout of the focus detecting pixels, are laid out on the second semiconductor chip 402. With this layout, an image at a high S/N ratio can be obtained without occupying the opening area of each pixel by wiring of the vertical output line 202b. Unlike the second embodiment, even the layout of focus detecting pixels such as the pixel p33 becomes almost the same as that of the remaining pixels, reducing the fear that the optical conditions and analog characteristic become different.

Not only readout circuits subsequent to the vertical output lines 202b are arranged on the second semiconductor chip 402, but some transistors in the focus detecting pixels may be arranged on the second semiconductor chip 402. For example, pixel selection switches 306 may be arranged on the second semiconductor chip 402. This makes it possible to ensure a large PD area of the focus detecting pixel and increase the sensitivity.

The embodiments of the present invention have been described. However, the present invention is not limited to these embodiments, and various modifications and changes can be made without departing from the scope of the invention.

For example, the third embodiment has described an arrangement in which all readout circuits subsequent to the vertical output lines are arranged independently for the focus detecting pixels. However, only the vertical output lines 202b and column common readout circuits 203b may be arranged independently. Although readout of the focus detecting pixels cannot be freely performed independently of the normal pixels, the circuit scale and power consumption can be suppressed by sharing the horizontal output line, differential amplifier, output terminal, and the like.

Figure 11B:
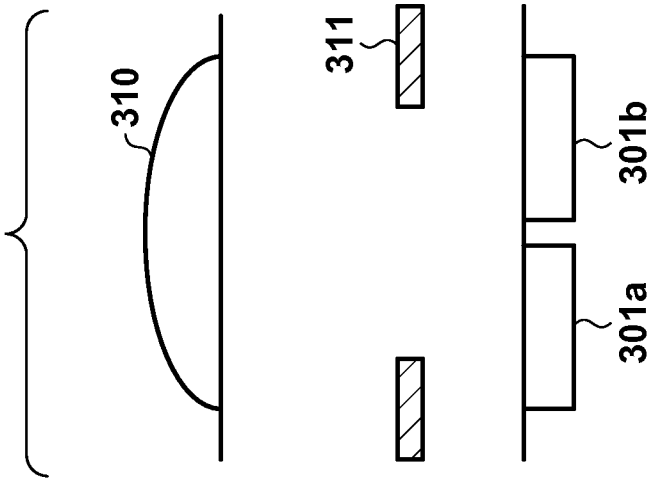
FIGS. 11A and 11B are views showing the arrangement of each pixel according to another embodiment.
Figure 11A:
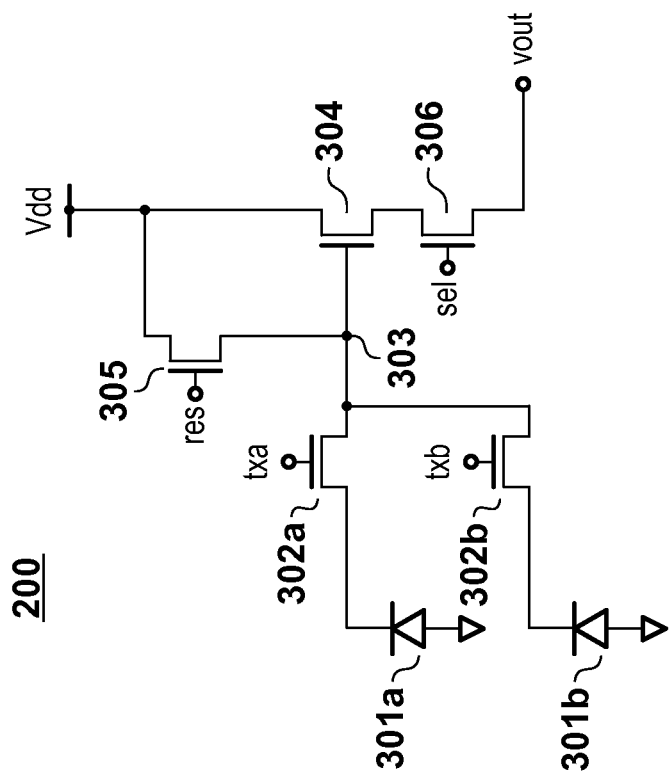

The pixel structure of the focus detecting pixel restricts the direction of an effective beam by decentering the opening of the light-shielding layer, as shown in FIG. 3. However, the present invention is not limited to this. For example, the pixel may have a structure in which two photodiodes (PDs) and two transfer gates are arranged, as shown in FIGS. 11A and 11B, and the signal of either PD is read out to restrict an effective beam. In this case, all pixels have the same sectional structure. The normal pixel simultaneously transfers and reads out the signals of the PDs 301a and 301b. The focus detecting pixel selects and reads out either of the PDs 301a and 301b for each pixel. It is also conceivable that the normal pixel does not take this structure, and is constituted as shown in FIG. 3B.

Since the signal of the focus detecting pixel is not used for image generation, the signal of a pixel of interest among the focus detecting pixels needs to be interpolated in image generation. For example, this interpolation operation is performed not by calculation, but by averaging the pixel values of neighboring pixels by the image sensor 107.

Fourth Embodiment

Figure 12:
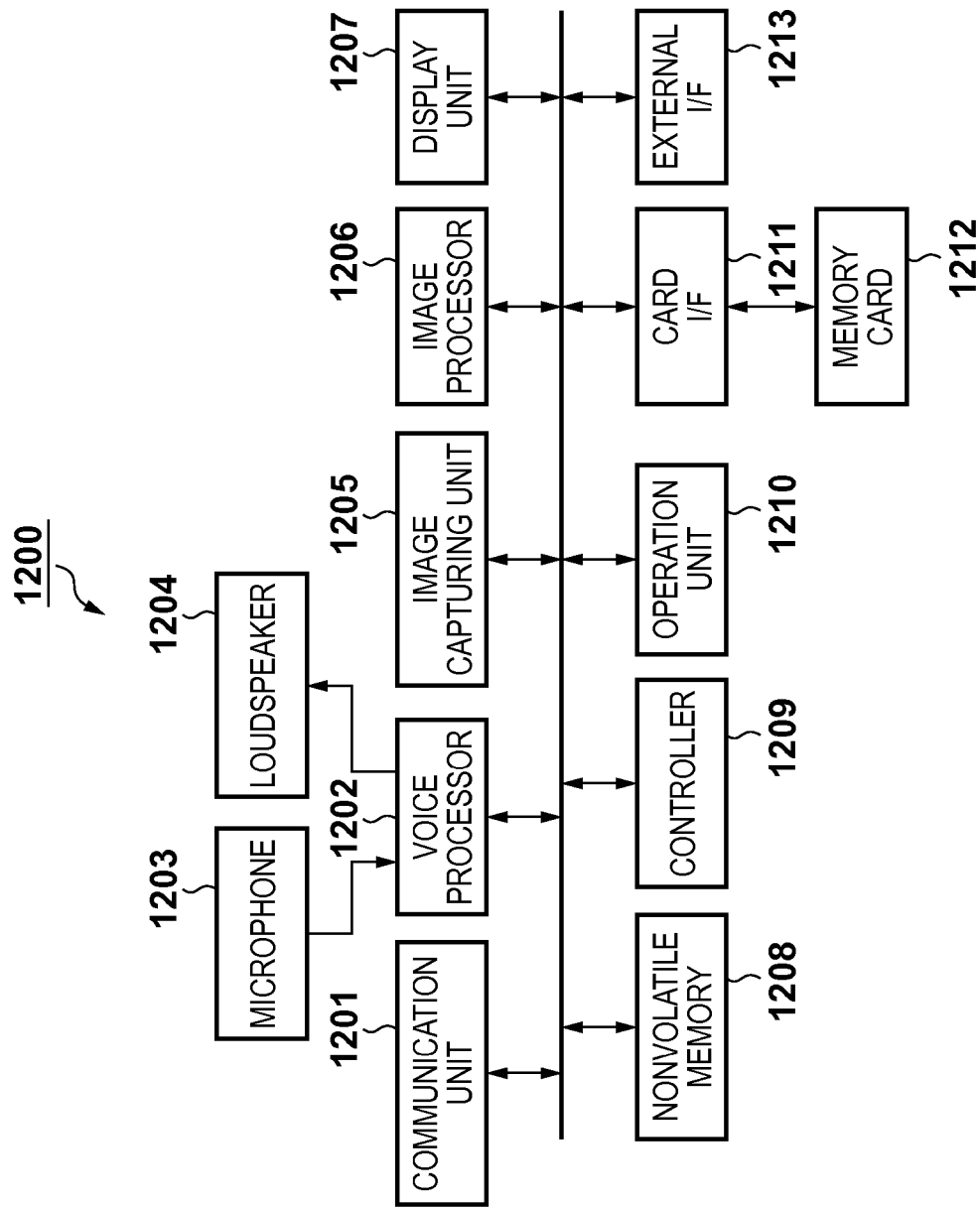
FIG. 12 is a block diagram showing the arrangement of a mobile telephone according to the fourth embodiment.

FIG. 12 is a block diagram showing the arrangement of a mobile telephone 1200 according to the fourth embodiment. The mobile telephone 1200 according to the fourth embodiment has the e-mail function, Internet connection function, image capturing/playback function, and the like, in addition to the voice communication function.

In FIG. 12, a communication unit 1201 communicates voice data and image data with another telephone by a communication method complying with a communication carrier with which the user has a contract. In voice communication, a voice processor 1202 converts voice data from a microphone 1203 into a format suited for origination, and sends the converted data to the communication unit 1201. Also, the voice processor 1202 decodes voice data from a voice communication partner that has been sent from the communication unit 1201, and sends the decoded data to a loudspeaker 1204. An image capturing unit 1205 includes the image sensor 107 described in one of the first to third embodiments, captures an image of an object, and outputs image data. At the time of capturing an image, an image processor 1206 processes image data captured by the image capturing unit 1205, converts the data into a format suited for recording, and outputs the converted data. At the time of playing back a recorded image, the image processor 1206 processes the played-back image, and sends the processed image to a display unit 1207. The display unit 1207 includes a liquid crystal display panel about several inches in size, and displays various screens in accordance with instructions from a controller 1209. A nonvolatile memory 1208 stores information of an address book, and data such as data of e-mail, and image data captured by the image capturing unit 1205.

The controller 1209 includes a CPU and memory, and controls the respective units of the mobile telephone 1200 in accordance with a control program stored in the memory (not shown). An operation unit 1210 includes a power button, number keys, and various other operation keys used to input data by the user. A card I/F 1211 records and plays back various data on and from a memory card 1212. An external I/F 1213 transmits, to an external device, data stored in the nonvolatile memory 1208 and memory card 1212, and receives data transmitted from an external device. The external I/F 1213 performs communication by a well-known communication method such as a wired communication method (for example, USB) or wireless communication.

Next, the voice communication function in the mobile telephone 1200 will be explained. When calling a voice communication partner, the user operates the number keys of the operation unit 1210 to input the number of the voice communication partner, or displays, on the display unit 1207, an address book stored in the nonvolatile memory 1208, selects the voice communication partner, and designates origination. When the origination is designated, the controller 1209 originates a call to the voice communication partner via the communication unit 1201. If the voice communication partner answers the call, the communication unit 1201 outputs voice data of the partner to the voice processor 1202, and in addition, transmits voice data of the user to the partner.

When sending e-mail, the user designates creation of mail by using the operation unit 1210. When the creation of mail is designated, the controller 1209 displays a mail creation screen on the display unit 1207. The user inputs a destination address and body by using the operation unit 1210, and designates sending. If sending of the mail is designated, the controller 1209 sends address information and data of the mail body to the communication unit 1201. The communication unit 1201 converts the mail data into a format suited for communication, and sends it to the destination. If the communication unit 1201 receives e-mail, it converts the received mail data into a format suited for display, and displays it on the display unit 1207.

Next, the image capturing function in the mobile telephone 1200 will be explained. When the user operates the operation unit 1210 to set the image capturing mode and then designate capturing of a still image or moving image, the image capturing unit 1205 captures still image data or moving image data, and sends it to the image processor 1206. The image processor 1206 processes the captured still image data or moving image data, and stores the processed data in the nonvolatile memory 1208. The image processor 1206 sends the captured still image data or moving image data to the card I/F 1211. The card I/F 1211 stores the still image or moving image data in the memory card 1212.

The mobile telephone 1200 can transmit, as a file attached to e-mail, a file including a still image or moving image data captured in this manner. More specifically, when transmitting e-mail, an image file stored in the nonvolatile memory 1208 or memory card 1212 is selected, and transmission of the image file as an attached file is designated.

The mobile telephone 1200 can also transmit a file including a captured still image or moving image data to an external device such as a PC or another telephone via the external I/F 1213. The user operates the operation unit 1210 to select an image file stored in the nonvolatile memory 1208 or memory card 1212, and designate transmission. The controller 1209 controls the external I/F 1213 to read out the selected image file from the nonvolatile memory 1208 or memory card 1212, and transmit it to the external device.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application Nos. 2013-248343, filed Nov. 29, 2013, and 2014-217662, filed Oct. 24, 2014, which are hereby incorporated by reference herein in their entirety.

What is claimed is:

1. An image sensor in which a first semiconductor chip and a second semiconductor chip are stacked on each other, the first semiconductor chip including:
a pixel portion including a plurality of first pixels for generating a captured image and a plurality of second pixels for controlling an image capturing operation; and
a first driving circuit which drives the plurality of first pixels, and
the second semiconductor chip including:
a second driving circuit which drives the plurality of second pixels,
wherein the second driving circuit drives the plurality of second pixels from the side of the second semiconductor chip, independently of the driving of the plurality of first pixels by the first driving circuit.

2. The image sensor according to claim 1, wherein the first semiconductor chip further includes a first readout circuit which reads out signals of the plurality of first pixels, and the second semiconductor chip further includes a second readout circuit which reads out signals of the plurality of second pixels.

3. The image sensor according to claim 2, wherein the second readout circuit simultaneously reads out pixels arranged on different rows in the plurality of second pixels.

4. The image sensor according to claim 2, wherein the first readout circuit and the second readout circuit read out signals of the plurality of first pixels and signals of the plurality of second pixels temporally parallel.

5. The image sensor according to claim 1, wherein some of transistors arranged in respective pixels in the plurality of second pixels are arranged on the second semiconductor chip.

6. A mobile telephone comprising an image sensor defined in claim 1.

7. An image capturing apparatus comprising an image sensor defined in claim 1.

8. The apparatus according to claim 7, wherein a captured image is displayed or recorded.

9. The apparatus according to claim 8, wherein pixel values of first pixels positioned around the respective second pixels are used as pixel values of the plurality of second pixels in a case where generating the captured image.

10. The apparatus according to claim 9, wherein an average value of the pixel values of the first pixels positioned around the respective second pixels are used as the pixel values of the plurality of second pixels.

11. The apparatus according to claim 7, wherein a focus-detecting operation is performed based on output signals of the plurality of second pixels.

12. The apparatus according to claim 11, further comprising a focus adjusting unit which adjusts a focus of the captured image based on an output signal of the plurality of second pixels for the focus-detecting operation.

13. The image sensor cording to claim 1, wherein the first semiconductor chip further includes first signal output lines to which signals are output from the plurality of first pixels, and the second semiconductor chip further includes second signal output lines to which signals are output from the plurality of second pixels.

14. An image sensor in which a first semiconductor chip and a second semiconductor chip are stacked on each other, the first semiconductor chip including:
a pixel portion including a plurality of first pixels for generating a captured image and a plurality of second pixels for controlling an image capturing operation, and
the second semiconductor chip including:
a driving circuit which drives the plurality of second pixels independently of driving of the plurality of first pixels.

15. The image sensor according to claim 14, wherein the second semiconductor chip further includes a readout circuit which reads out signals of the plurality of second pixels.

16. The image sensor according to claim 14, wherein the second semiconductor chip further includes signal output lines to which signals are output from the plurality of second pixels.

17. The image sensor according to claim 14, wherein a focus-detecting operation is performed based on output signals of the plurality of second pixels.

18. The image sensor according to claim 4, wherein the captured image is displayed or recorded.

19. The image sensor according to claim 14, wherein pixel values of first pixels positioned around the respective second pixels are used as pixel values of the plurality of second pixels in a case where generating the captured image.

20. The image sensor according to claim 19, wherein an average value of the pixel values of the first pixels positioned around the respective second pixels are used as the pixel values of the plurality of second pixels.

21. An image capturing apparatus comprising au image sensor defined in claim 14.

22. A mobile telephone comprising an image sensor defined in claim 14.

* * * * *